US011456413B2

(12) United States Patent
Yogendra et al.

(10) Patent No.: US 11,456,413 B2
(45) Date of Patent: Sep. 27, 2022

(54) IN-SITU DRIFT-MITIGATION LINER FOR PILLAR CELL PCM

(71) Applicant: International Business Machines Corporation, Armonk, NY (US)

(72) Inventors: Karthik Yogendra, Albany, NY (US); Praneet Adusumilli, Somerset, NJ (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/105,699

(22) Filed: Nov. 27, 2020

(65) Prior Publication Data

US 2022/0173308 A1 Jun. 2, 2022

(51) Int. Cl.
*H01L 27/24* (2006.01)
*H01L 45/00* (2006.01)

(52) U.S. Cl.
CPC .............. *H01L 45/06* (2013.01); *H01L 27/24* (2013.01); *H01L 45/1253* (2013.01); *H01L 45/1608* (2013.01); *H01L 45/1675* (2013.01)

(58) Field of Classification Search
None
See application file for complete search history.

(56) References Cited

U.S. PATENT DOCUMENTS 6,969,866 B1 11/2005 Lowrey et al.
9,608,042 B2 3/2017 Pellizzer et al.
10,008,665 B1 6/2018 Gealy et al.
10,050,194 B1 8/2018 Nardi et al.
10,262,730 B1 4/2019 Nardi et al.
10,522,754 B2 12/2019 Narayanan et al.
(Continued)

FOREIGN PATENT DOCUMENTS

CN 107112345 A 8/2017
CN 110036479 A 7/2019
WO WO2018186940 A1 10/2018

OTHER PUBLICATIONS

Fong et al., Phase-Change Memory—Towards a Storage-Class Memory, IEEE Transactions on Electron Devices, 64 (11), pp. 4374-4385, Sep. 2017.

(Continued)

*Primary Examiner* — Mounir S Amer
(74) *Attorney, Agent, or Firm* — Min Jia Zheng; Otterstedt & Kammer PLLC

(57) ABSTRACT

A method for forming an in-situ drift-mitigation liner on a sidewall of a phase-change material (PCM) device stack includes providing an intermediate device including a substrate including a bottom wiring portion, a bottom electrode metal layer, a drift-mitigation liner layer, an active area layer, a carbon layer, a top electrode metal layer, patterning the top electrode metal layer to form a top electrode, performing a first intermediate angle ion beam etch (IBE), etching the carbon layer and the active area layer, which are formed on the drift-mitigation liner, to form a carbon portion and an active area portion of the PCM device stack, and performing a low angle IBE, etching the drift-mitigation liner and redepositing material etched from the drift-mitigation liner as a conductive liner material on sidewalls of the PCM device stack including exposed portions of the carbon portion, the active area portion, and the top electrode.

7 Claims, 4 Drawing Sheets

(56) References Cited

U.S. PATENT DOCUMENTS

| | | | | |
|---|---|---|---|---|
| 10,600,960 | B2 * | 3/2020 | Fantini | H01L 45/1233 |
| 10,763,307 | B1 | 9/2020 | Carta et al. | |
| 2014/0227801 | A1 | 8/2014 | Hsu et al. | |
| 2016/0005966 | A1 * | 1/2016 | Kim | H01L 45/144 438/127 |
| 2018/0097177 | A1 * | 4/2018 | Chang | H01L 45/1233 |
| 2019/0393268 | A1 | 12/2019 | Lai et al. | |
| 2020/0136031 | A1 | 4/2020 | Yang et al. | |

OTHER PUBLICATIONS

Authorized Officer LV Yuan, PRC National IP Administration as ISA, related PCT application PCT/CN2021/125155, ISR and Written Opinion, 9 pages total, dated Jan. 12, 2022.

* cited by examiner

IN-SITU DRIFT-MITIGATION LINER FOR PILLAR CELL PCM

BACKGROUND

The present invention relates to semiconductor devices and more particularly to a method of forming an in-situ drift-mitigation liner on the sidewall of a Phase-Change Memory (PCM) device during the ion-beam etch.

Phase-Change Memory (PCM) is based on a chalcogenide glass material, which changes its phase from crystalline to amorphous and back again when suitable electrical currents are applied. GST alloy (germanium-antimony-tellurium or $Ge_2Sb_2Te_5$) is one such chalcogenide glass material. Each phase has a differing resistance level, which is stable until the phase is changed. The maximum and minimum resistance levels in a PCM device are the basis for binary one or zero values.

During electrical programming of the PCM device, at least some (or in some cases all) of the phase change material undergoes phase transformations, which changes the electrical resistance of the PCM device.

Phase change materials suffer from resistance-drift, prominently in the amorphous phase, where resistance increases over time according to a power law. Resistant-drift needs to be mitigated for analog computing applications where multiple states are required for computation.

One way to do this is by using a conductive liner that can separate the write and read path of the PCM cell by acting as a variable resistor in parallel. For a PVD based pillar cell, this involves deposition of a conductive liner around the GST fill. However, air-exposure post-RIE and oxidation of the GST is a challenge.

BRIEF SUMMARY

According to an embodiment of the present invention, a method for forming an in-situ drift-mitigation liner on a sidewall of a phase-change material (PCM) device stack comprises providing an intermediate device comprising, sequentially, a substrate comprising a bottom wiring portion, a bottom electrode metal layer, a drift-mitigation liner layer, an active area layer, a carbon layer, a top electrode metal layer, a dielectric hardmask layer, an OPL, a silicon-based anti-reflective coating layer, and a patterned resist (201), patterning, using the patterned resist, the dielectric hardmask and the top electrode metal layer to form a top electrode (202), performing a first intermediate angle ion beam etch (IBE), etching the carbon layer and the active area layer, which are formed on the drift-mitigation liner, to form a carbon portion and an active area portion of the PCM device stack (203), and performing a low angle IBE, etching the drift-mitigation liner and redepositing material etched from the drift-mitigation liner as a conductive liner material on sidewalls of the PCM device stack including exposed portions of the carbon portion, the active area portion, and the top electrode (204).

According to some embodiments, a phase-change memory (PCM) device comprises a substrate (101) comprising a bottom wiring portion (102), a PCM device stack (110), having sidewalls, comprising a bottom electrode (103) disposed on the bottom wiring portion, a drift-mitigation liner (104) disposed on the bottom electrode, an active area layer (105) disposed on the drift-mitigation liner, a carbon layer (106) disposed on the active area layer, and a top electrode (107) disposed on the carbon layer, and a conductive liner material (108) on exposed portions of the carbon layer, the active area layer, and the top electrode forming a portion of the sidewalls of the PCM device stack.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

One or more embodiments of the invention or elements thereof can be implemented in the form of a computer program product including a computer readable storage medium with computer usable program code for performing the method steps indicated. Furthermore, one or more embodiments of the invention or elements thereof can be implemented in the form of a system (or apparatus) including a memory, and at least one processor that is coupled to the memory and operative to perform exemplary method steps. Yet further, in another aspect, one or more embodiments of the invention or elements thereof can be implemented in the form of means for carrying out one or more of the method steps described herein; the means can include (i) hardware module(s), (ii) software module(s) stored in a computer readable storage medium (or multiple such media) and implemented on a hardware processor, or (iii) a combination of (i) and (ii); any of (i)-(iii) implement the specific techniques set forth herein.

Techniques of the present invention can provide substantial beneficial technical effects. For example, one or more embodiments may provide for:

- a method for forming an in-situ drift-mitigation liner on a sidewall of a PCM device;
- a method for forming an in-situ drift-mitigation liner on a sidewall of a PCM device that avoids air-exposure post-RIE; and
- a method for forming an in-situ drift-mitigation liner on a sidewall of a PCM device that avoids oxidation of a GST.

These and other features and advantages of the present invention will become apparent from the following detailed description of illustrative embodiments thereof, which is to be read in connection with the accompanying drawings.

BRIEF DESCRIPTION OF THE SEVERAL VIEWS OF THE DRAWINGS

Preferred embodiments of the present invention will be described below in more detail, with reference to the accompanying drawings.

DETAILED DESCRIPTION

Figure 1:
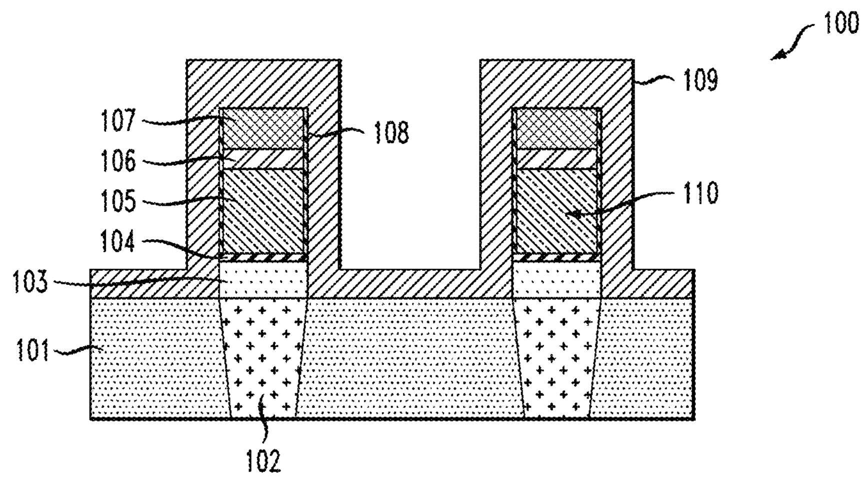
FIG. 1 shows a PCM device according to at least one embodiment of the present invention.

Embodiments of the present invention are directed to methods of forming an in-situ drift-mitigation liner on a sidewall of a PCM device during an ion-beam etch (IBE).

According to at least one embodiment of the present invention, a PCM device 100 comprises a substrate 101 (an interlayer dielectric (ILD)), and a bottom wiring level 102. A stack 110 disposed on the bottom wiring level 102 comprising a bottom electrode 103, a drift-mitigation liner 104, GST 105, a carbon layer 106, and a top electrode 107. A sidewall-conductive liner 108 is disposed on sidewalls of the stack 110. The sidewall-conductive liner 108 has a thickness of about 2-10 nanometers (nm). The stack 110 and sidewall-conductive liner 108 are encapsulated in a layer of SiN (an encapsulation layer 109).

According to some embodiments, an IBE is used to pattern an active area of the device GST. A low angle (from normal) IBE is used to encapsulate the PCM device in-situ by redepositing a portion of the drift-mitigation liner from below the GST on to the sidewall of the device. An optional surface treatment can be applied subsequently to modify the microstructure or composition of this conductive liner (without oxidizing or modifying the GST/liner interface).

Figure 2:
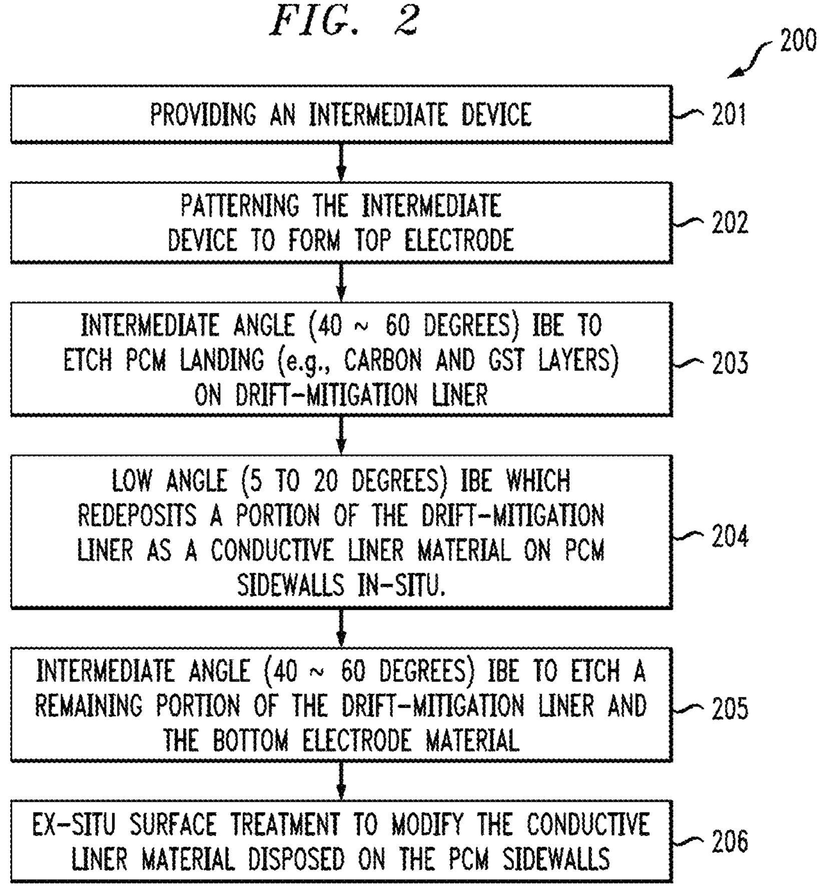
FIG. 2 shows a method for forming an in-situ drift-mitigation liner on a sidewall of a PCM device, according to at least one embodiment of the present invention.

FIG. 2 shows a method 200 for forming an in-situ drift-mitigation liner on a sidewall of a PCM device stack according to at least one embodiment of the present invention. According to FIG. 2, the method includes providing an intermediate device comprising, sequentially, a substrate comprising a bottom wiring portion, a bottom electrode metal layer, a drift-mitigation liner layer, an active area layer, a carbon layer, a top electrode metal layer, a dielectric hardmask layer, an OPL, a silicon-based anti-reflective coating layer, and a patterned resist 201, and patterning, using the patterned resist, the dielectric hardmask and the top electrode metal layer to form a top electrode 202. The method further includes performing an intermediate angle (for example, between about 40°-60° from vertical) IBE 203, etching a carbon layer and a GST layer, which are formed on a drift-mitigation liner. At block 204, a low angle (for example, between about 5°-20° from vertical) IBE etches the drift-mitigation liner and redeposits the etched material (from the drift-mitigation liner) as a conductive liner material on the PCM device stack sidewall in-situ. Here, the PCM device stack includes the GST 105, the carbon layer 106, and the top electrode 107. At block 205, a second intermediate angle IBE is performed, etching a remainder of the drift-mitigation liner and a bottom electrode material to complete the PCM device stack. At block 206, an ex-situ surface treatment (e.g., a plasma-based treatment and/or thermal anneal) is performed, modifying a composition or microstructure of the conductive liner material on the sidewall of the PCM device stack.

According to at least one embodiments, the IBE processes performed at blocks 203 and 204 can include performing the etch at more than one voltage. For example, the intermediate angle IDE process 203 can including performing a first etch at a first relatively high voltage, followed by a second etch at a second relatively low voltage.

Figure 3:
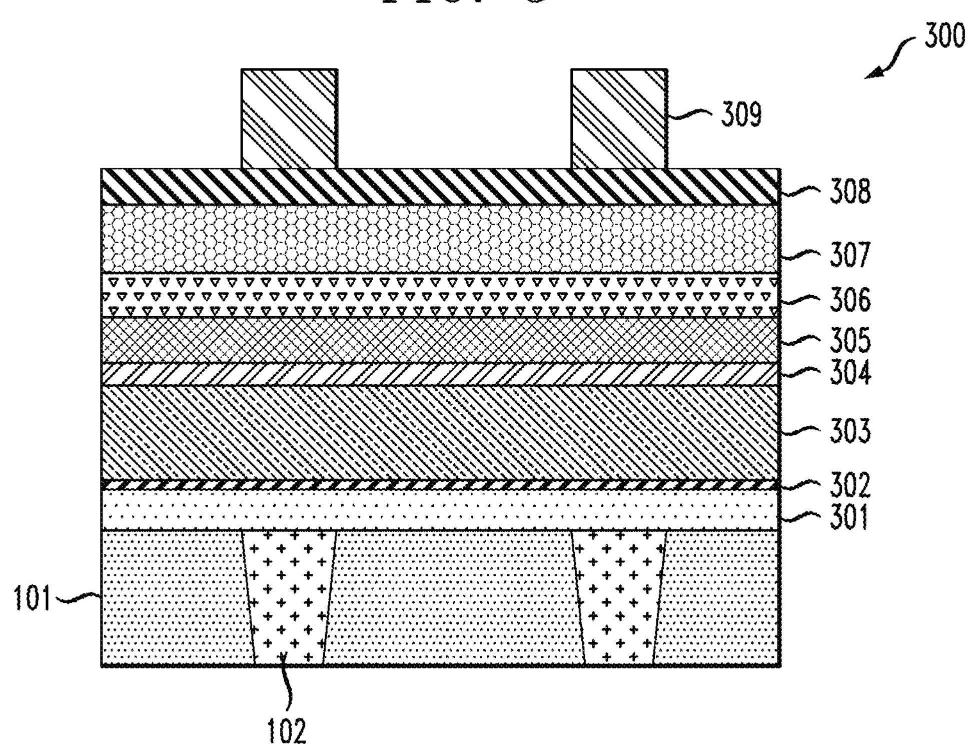
FIGS. 3-7 show a method for forming an in-situ drift-mitigation liner on a sidewall of a PCM device, according to at least one embodiment of the present invention.

According to some embodiments, FIG. 3 shows a device stack 300 of deposited layers on the substrate 101 (an interlayer dielectric (ILD)) and the bottom wiring level 102. The device stack 300 comprises a bottom electrode metal layer 301, drift-mitigation liner layer 302, GST layer 303, a carbon layer 304, top electrode metal layer 305, a dielectric hardmask 306, an organic planarization layer (OPL) 307, a Silicon-Containing Anti-Reflective Coating Layer (SiARC) layer 308, and a resist 309.

According to some embodiments, the resist 309, SiARC 308, and the OPL 307 are removed by a reactive ion etch (RIE), which is a selective etch for these layers.

Figure 4:
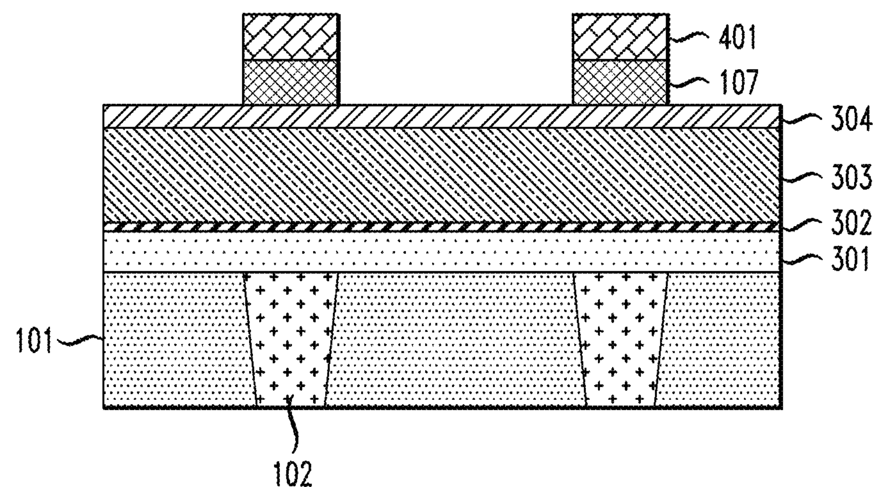

As shown in FIG. 4, a pattern transfer of the resist 309 into dielectric hardmask 306 and top electrode metal layer 305 is performed, stopping on the carbon layer 304. Accordingly, the top electrode 107 is formed with a dielectric hardmask cap 401. According to some embodiments, the pattern transfer can include a halide-chemistry based RIE.

Figure 5:
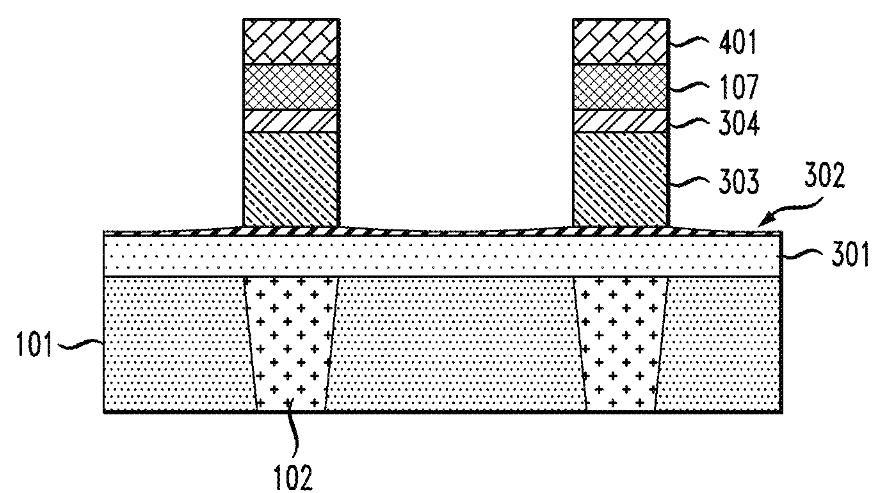

As shown in FIG. 5, an intermediate angle (for example, between about 40°-60° from vertical) IBE (e.g., Ar (argon) or Ar/$H_2$ (hydrogen) or Ar/$N_2$ (nitrogen) chemistry) removes portions of the carbon layer 304 and the GST film 303 not protected by the dielectric hardmask cap 401. The remaining stack comprises the GST 105, the carbon layer 106, the top electrode 107, and the dielectric hardmask cap 401.

Figure 6:
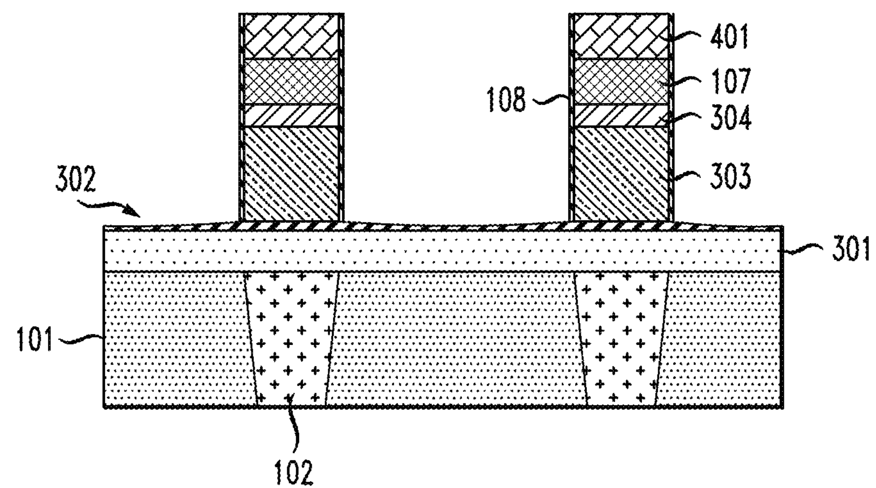

As shown in FIG. 6, a low angle (for example, between about 5°-20° from vertical) IBE (e.g., Ar or Ar/$H_2$ or Ar/$N_2$ chemistry) is performed, redepositing a portion of the material of the drift-mitigation liner layer 302 on to the sidewall and forming the conductive liner 108 on sidewalls of the stack. According to some embodiments, the low angle IBE is configured to form the conductive liner 108 having a thickness of about 2-10 nm.

According to one or more embodiments, the conductive liner 108 is disposed in contact with the GST 105, carbon layer 106, and the top electrode 107. According to some embodiments, the conductive liner 108 can be formed of nitrides, carbides, or oxides of titanium (Ti), tungsten (W), tantalum (Ta), hafnium (Hf), vanadium (V), or ruthenium (Ru). For example, the conductive liner 108 can be formed of, for example, titanium nitride (TiN), titanium carbide (TiC), tungsten carbide (WC), tungsten nitride (WN), carbon (C), nitridohafnium (HfN), hafnium carbide (HfC), vanadium nitride (VN), vanadium carbides (VC), tantalum nitride (TaN), tantalum carbide (TaC), titanium silicon nitride (TiSiN), titanium aluminum nitride (TiAlN), tantalum silicon nitride (TaSiN), tantalum aluminum nitride (TaAlN), other carbides or nitrides of transition, refractory metals, etc. According to some embodiments, the conductive liner 108 is made of carbon or carbon-containing materials (for example, SiC).

Figure 7:
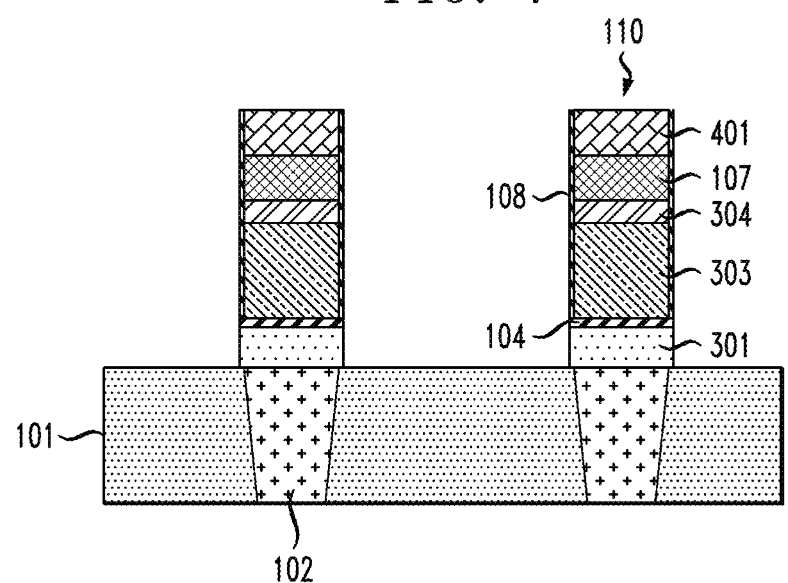

As shown in FIG. 7, a second intermediate angle (between about 40°-60°) IBE removes the residual drift-mitigation liner layer 302 and patterns the bottom electrode metal layer 301 to form the completed stack 110 comprising the bottom electrode 103 and the drift-mitigation liner 104.

According to some embodiments, an optional surface treatment of the conductive liner 108 is performed. The stoichiometry of the drift-mitigation layer can be modified during the IBE re-deposition process 204, for example, due to damage caused by an Ar-based removal of N from TiN or WN, or other metal nitride films. Thus, the surface treatment (e.g., a plasma nitridation or carbonation for metal carbides) can restore the stoichiometry of the drift-mitigation layer. According to some embodiments, the surface treatment can include applying an $H_2$ based plasma, removing oxygen from the conductive liner 108, followed by application of an $N_2$/$NH_3$ plasma, incorporating nitrogen into the conductive liner 108. For example, the $H_2$ based plasma can be used to reduce oxidized layers to metallic form, which can be subsequently subjected to nitridation or carbonation to adjust the stoichiometry and film properties.

According to some embodiments, one or more thermal anneals in $H_2$, $H_2$/$N_2$ ambients are performed.

According to some embodiments, the method further includes a dielectric encapsulation of the stack with a SiN film 109, resulting in the device shown in FIG. 1.

According to some embodiments, the substrate 101 is formed of silicon nitride (SiN). According to at least one embodiment, the top and bottom electrodes 103 and 107 can be formed of, for example, TiN, W, WN, or TaN.

According to some embodiments, at blocks 203 and 204, the Ar-based gases used for the IBE can be replaced by using another noble gas with a heavy atomic mass, such as xenon (Xe).

Recapitulation:

According to some embodiments, a method for forming an in-situ drift-mitigation liner on a sidewall of a phase-change material (PCM) device stack comprises providing an intermediate device comprising, sequentially, a substrate comprising a bottom wiring portion, a bottom electrode metal layer, a drift-mitigation liner layer, an active area layer, a carbon layer, a top electrode metal layer, a dielectric hardmask layer, an OPL, a silicon-based anti-reflective coating layer, and a patterned resist (201), patterning, using the patterned resist, the dielectric hardmask and the top electrode metal layer to form a top electrode (202), performing a first intermediate angle ion beam etch (IBE), etching the carbon layer and the active area layer, which are formed on the drift-mitigation liner, to form a carbon portion and an active area portion of the PCM device stack (203), and performing a low angle IBE, etching the drift-mitigation liner and redepositing material etched from the drift-mitigation liner as a conductive liner material on sidewalls of the PCM device stack including exposed portions of the carbon portion, the active area portion, and the top electrode (204).

According to some embodiments, a phase-change memory (PCM) device comprises a substrate (101) comprising a bottom wiring portion (102), a PCM device stack (110), having sidewalls, comprising a bottom electrode (103) disposed on the bottom wiring portion, a drift-mitigation liner (104) disposed on the bottom electrode, an active area layer (105) disposed on the drift-mitigation liner, a carbon layer (106) disposed on the active area layer, and a top electrode (107) disposed on the carbon layer, and a conductive liner material (108) on exposed portions of the carbon layer, the active area layer, and the top electrode forming a portion of the sidewalls of the PCM device stack.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A phase-change memory (PCM) device comprising:

a substrate comprising a bottom wiring portion;

a PCM device stack, having sidewalls, comprising:

a bottom electrode disposed on the bottom wiring portion;

a drift-mitigation liner disposed on the bottom electrode;

an active area layer disposed on the drift-mitigation liner;

a carbon layer disposed on the active area layer; and a top electrode disposed on the carbon layer; and a conductive liner material on exposed portions of the carbon layer, the active area layer, and the top electrode forming a portion of the sidewalls of the PCM device stack, wherein the conductive liner material is not formed on sidewalls of the bottom electrode and the drift-mitigation liner.

2. The PCM device of claim 1, further comprising a film encapsulating the PCM device stack.

3. The PCM device of claim 2, wherein the film is disposed on exposed portions of the substrate.

4. The PCM device of claim 1, wherein the conductive liner material has a thickness between about 2 and 10 nanometers.

5. A phase-change memory (PCM) device comprising:

a substrate comprising a bottom wiring portion;

a PCM device stack, having sidewalls, comprising:

a bottom electrode disposed on the bottom wiring portion;

a drift-mitigation liner disposed on the bottom electrode;

an active area layer disposed on the drift-mitigation liner;

a carbon layer disposed on the active area layer; and a top electrode disposed on the carbon layer;

a conductive liner material on exposed portions of the carbon layer, the active area layer, and the top electrode forming a portion of the sidewalls of the PCM device stack; and a film encapsulating the PCM device stack directly on the conductive liner material on exposed portions of the carbon layer, the active area layer, and the top electrode, and directly on sidewalls of the bottom electrode and the drift-mitigation liner.

6. The PCM device of claim 5, wherein the film is disposed on exposed portions of the substrate.

7. The PCM device of claim 5, wherein the conductive liner material has a thickness between about 2 and 10 nanometers.

* * * * *